(12) United States Patent (10) Patent No.: US 7,045,858 B2
Matsuda et al. (45) Date of Patent: May 16, 2006

(54) SEMICONDUCTOR DEVICE AND METHOD OF MANUFACTURING THE SAME

(75) Inventors: Noboru Matsuda, Kanagawa (JP); Shoji Takayama, Kanagawa (JP); Yasuo Ebuchi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 125 days.

(21) Appl. No.: 10/820,792

(22) Filed: Apr. 9, 2004

(65) Prior Publication Data

US 2005/0191810 A1 Sep. 1, 2005

(30) Foreign Application Priority Data

Feb. 26, 2004 (JP) ............................. 2004-051900

(51) Int. Cl.
*H01L 29/94* (2006.01)

(52) U.S. Cl. ...................... 257/330; 257/329; 257/331; 257/332; 257/410

(58) Field of Classification Search ................ 257/330, 257/410, 332, 331, 329
See application file for complete search history.

(56) References Cited

U.S. PATENT DOCUMENTS 5,561,308 A * 10/1996 Kamata et al. ............. 257/301
5,937,296 A * 8/1999 Arnold ....................... 438/270
6,127,712 A * 10/2000 Wu ............................. 257/410
6,362,025 B1 * 3/2002 Patti et al. .................. 438/138

FOREIGN PATENT DOCUMENTS

JP 7-50411 2/1995
JP 2001-345446 12/2001

\* cited by examiner

*Primary Examiner*—Christian D. Wilson
*Assistant Examiner*—Douglas Menz
(74) *Attorney, Agent, or Firm*—Oblon, Spivak, McClelland, Maier & Neustadt, P.C.

(57) ABSTRACT

There is provided a semiconductor device comprising a first semiconductor layer of a first conductivity type, a second semiconductor layer of a second conductivity type formed on the first semiconductor layer, the second conductivity type being different from the first conductivity type, a third semiconductor layer of the first conductivity type selectively formed on the second semiconductor layer, a trench formed through the third semiconductor layer and the second semiconductor layer to reach the first semiconductor layer, a gate dielectric film formed along side and bottom surfaces of the trench, and a gate electrode formed to be in contact with the gate dielectric film at the side surfaces of the trench, surfaces of the gate electrode that are opposite to the surfaces contacting the gate dielectric film, and the gate dielectric film at a bottom of the trench forming a hollow portion extending from the bottom to an opening side of the trench.

17 Claims, 11 Drawing Sheets

A-A SECTION

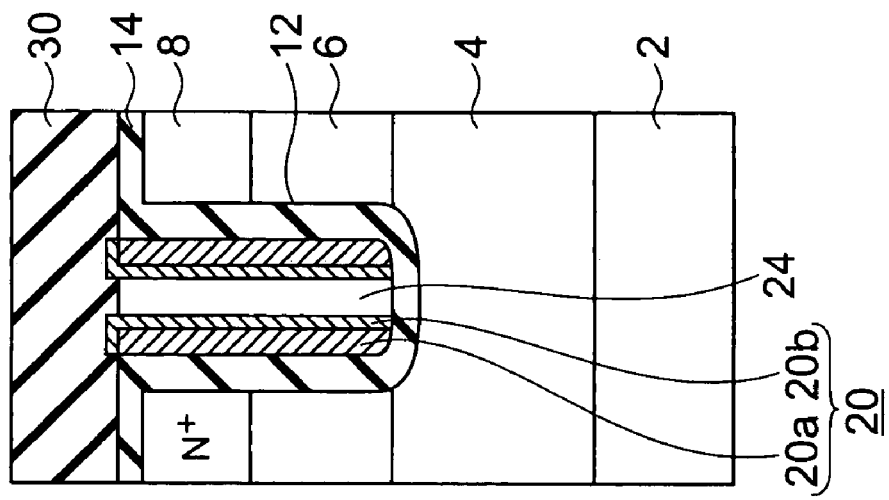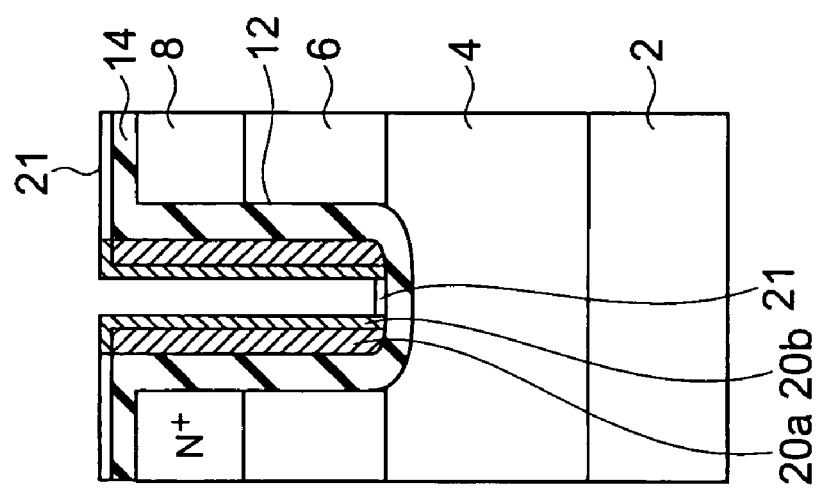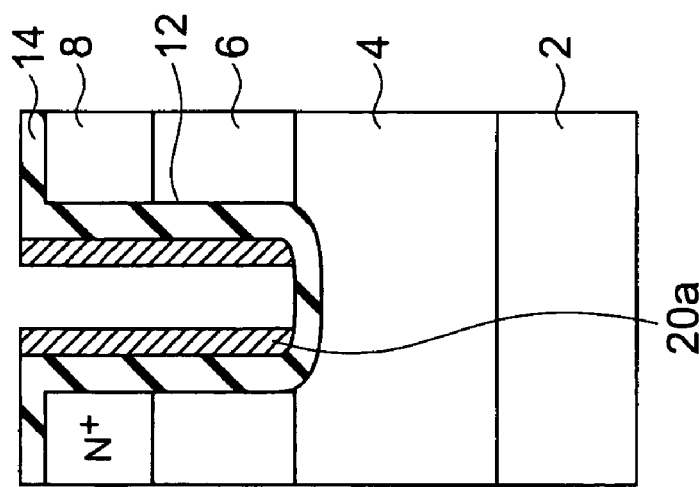

SEMICONDUCTOR DEVICE AND METHOD OF MANUFACTURING THE SAME

CROSS-REFERENCE TO RELATED APPLICATION

This application is based upon and claims the benefit of priority from prior Japanese Patent Application No. 2004-51900, filed on Feb. 26, 2004, the entire contents of which are incorporated herein by reference.

BACKGROUND OF THE INVENTION

1. Field of the Invention

The present invention relates to a semiconductor device having a trench gate structure and a method of manufacturing such a semiconductor device. In particular, the present invention relates to a power MOSFET.

2. Background Art

MOSFETs having a trench gate structure have been widely used as power MOS switches. Generally, a power MOS switch is required to operate at a high speed. The product (Ron×Qsw) of the ON resistance Ron and the switching charge Qsw of a MOSFET and the gate wiring resistance Rg serve as indicators of the high speed characteristic of a power MOS switch. The lower the values of these indicators, the better.

From this point of view, a semiconductor device, in which the wiring resistance Rg of the gate of a MOSFET is decreased, has been proposed as in, for example, Japanese Patent Laid-Open Publication No. 2001-345446. FIG. 15 shows the structure of such a semiconductor device. The conventional semiconductor device shown in FIG. 15 includes an $N^+$ type semiconductor substrate 2 serving as a drain, an $N^-$ type epitaxial layer 4 formed on the $N^+$ type semiconductor substrate 2, and a P type diffusion layer 6 formed on the $N^-$ type epitaxial layer 4. Furthermore, an $N^+$ type diffusion layer 8 serving as a source is selectively formed on the P type diffusion layer 6. A trench 12 is formed through the $N^+$ type diffusion layer 8 and the P type diffusion layer 6 so as to reach the $N^-$ type epitaxial layer 4. A gate dielectric film 14 is formed along the interior surface of the trench 12, i.e., on the side walls and the bottom of the trench 12. A gate electrode is formed inside the trench 12, the gate electrode being composed of a polycrystalline silicon layer 28 deposited to contact the gate dielectric film 14, and a silicide layer 29 deposited to completely fill in the trench 12.

However, in the semiconductor device disclosed in Japanese Patent Laid-Open Publication No. 2001-345446, a stress tends to occur at the interface between the polycrystalline silicon layer 28 and the silicide layer 29 at the bottom portion of the trench 12 when the silicide layer 29 is formed by the process of depositing a high melting point metal on the polycrystalline silicon layer 28 and performing a heat treatment thereby causing a reaction between the high melting point metal and polycrystalline silicon. This stress can be a cause of cracks generated in the P type diffusion layer 6 that serves as a channel and the $N^-$ type epitaxial layer 4. The cracks generated may lead to an increase in a leakage current Idss between the source and the drain, thereby degrading the reliability of the device.

SUMMARY OF THE INVENTION

A semiconductor device according to a first aspect of the present invention includes: a first semiconductor layer of a first conductivity type; a second semiconductor layer of a second conductivity type formed on the first semiconductor layer, the second conductivity type being different from the first conductivity type; a third semiconductor layer of the first conductivity type selectively formed on the second semiconductor layer; a trench formed through the third semiconductor layer and the second semiconductor layer to reach the first semiconductor layer; a gate dielectric film formed along side and bottom surfaces of the trench; and a gate electrode formed to be in contact with the gate dielectric film at the side surfaces of the trench, surfaces of the gate electrode that are opposite to the surfaces contacting the gate dielectric film, and the gate dielectric film at a bottom of the trench forming a hollow portion extending from the bottom to an opening side of the trench.

There is provided a method of manufacturing a semiconductor device according to a second aspect of the present invention, the semiconductor device including a semiconductor substrate including a first semiconductor layer of a first conductivity type, a second semiconductor layer of a second conductivity type formed on the first semiconductor layer, the second conductivity type being different from the first conductivity type, and a third semiconductor layer of the first conductivity type selectively formed on the second semiconductor layer, the method including: forming a trench through the third semiconductor layer and the second semiconductor layer to reach the first semiconductor layer; forming a gate dielectric film along side and bottom surfaces of the trench; forming a first electrode layer of polycrystalline silicon along the gate dielectric film in the trench; removing the first electrode layer at a bottom of the trench to leave the first electrode layer at the side surfaces; forming a high melting-point metal layer covering the first electrode layer remaining on the side surfaces of the trench; performing a heat treatment to allow silicon of the first electrode layer and the high melting-point metal to react with each other to form a first high melting-point metal silicide layer; and removing unreacted high melting-point metal to form a hollow portion extending from the bottom to an opening side of the trench with the gate dielectric film at the bottom of the trench and surfaces of the first high melting-point metal silicide layer.

BRIEF DESCRIPTION OF THE DRAWINGS

FIGS. 8A to 8C are sectional views showing steps of a method of forming a gate electrode of the semiconductor device according to the first embodiment of the present invention.

DESCRIPTION OF THE EMBODIMENTS

Hereinafter, embodiments of the present invention will be described with reference to the accompanying drawings.

(First Embodiment)

Figure 1:
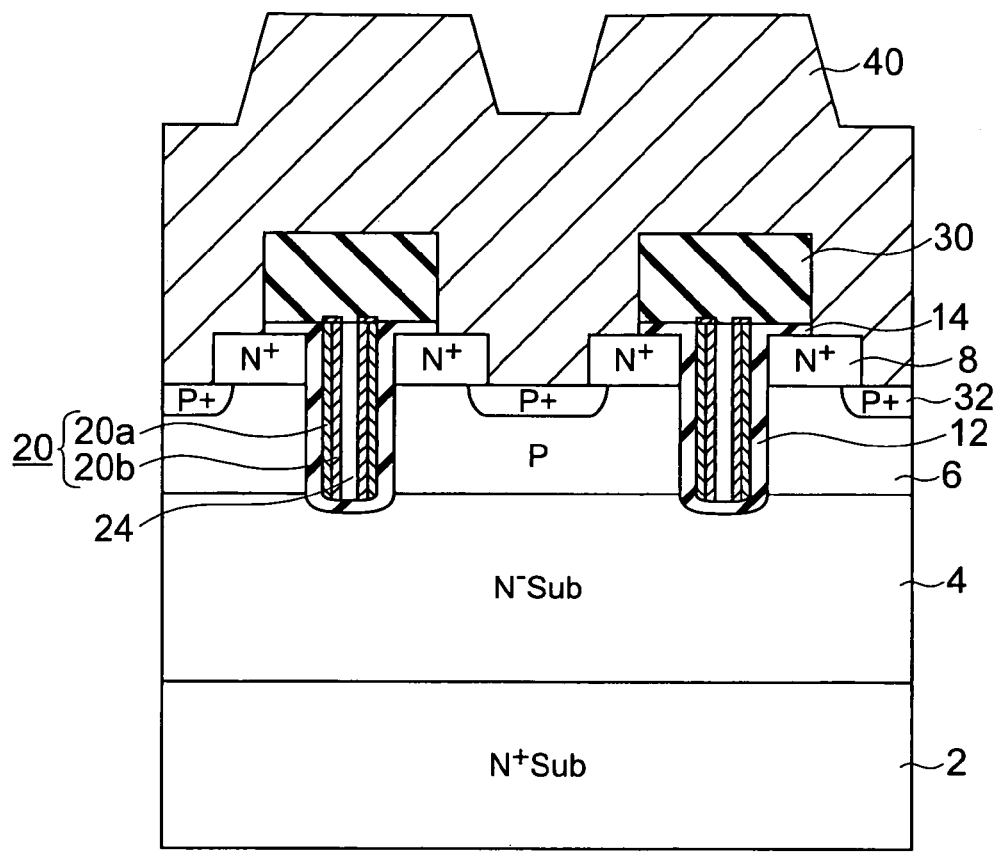
FIG. 1 is a sectional view showing the structure of a semiconductor device according to the first embodiment of the present invention.
Figure 2:
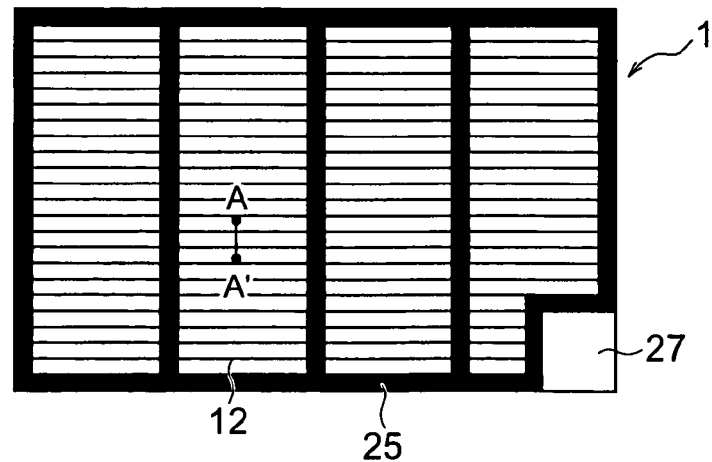
FIG. 2 is a plan view of the semiconductor device of the first embodiment.

A semiconductor device according to the first embodiment of the present invention will be described below with reference to FIGS. 1 and 2, of which FIG. 1 is a sectional view showing the structure of the semiconductor device of the first embodiment, and FIG. 2 is a plan view of the semiconductor device of the first embodiment before the source electrode, which will be described later, is formed. Furthermore, FIG. 1 corresponds to a sectional view taken along line A–A' of FIG. 2.

As shown in FIG. 1, in the semiconductor device of this embodiment, an N⁻ type epitaxial layer 4 is formed on an N⁺ type semiconductor substrate 2 serving as a drain, and a P type diffusion layer 6 is formed on the N⁻ type epitaxial layer 4. Then, an N⁺ type diffusion layer 8 serving as a source is selectively formed on the P type diffusion layer 6. A P⁺ type diffusion layer 32 is formed on the surface of the portions of the p type diffusion layer 6 where no N⁺ type diffusion layer 8 is formed, the P⁺ type diffusion layer 32 being for stabilizing the threshold value of the MOSFET. A trench 12 is formed through the N⁺ type diffusion layer 8 and the P type diffusion layer 6 so as to reach the epitaxial layer 4.

As shown in FIG. 2, a semiconductor chip 1 includes a plurality of trenches 12, each extending in a direction perpendicular to the paper surface. A gate dielectric film 14 is formed inside each trench 12, i.e., on the side walls and the bottom of each trench 12. A gate electrode 20 is formed in each trench 12 on the interior walls of which the gate dielectric film 14 is formed. The gate electrode 20 has a laminated structure composed of an electrode layer 20a formed only on each side wall of the trench 12 with the gate dielectric film 14 being sandwiched therebetween, and an electrode layer 20b formed of a silicide. A hollow portion 24 extending from the surface of the gate dielectric film 14 at the bottom of the trench 12 to the uppermost portion of the trench 12 is defined by the electrode layer 20b. The hollow portion 24 extends in a direction perpendicular to the paper surface of FIG. 1, i.e., in the longitudinal direction of the trench 12. An interlayer dielectric film 30 is formed so as to cover the upper portion of the gate electrode 20. Thus, the hollow portion 24 is defined by the gate dielectric film 14 at the bottom of the trench 12, the interlayer dielectric film 30 above the trench 12, and the surface of the electrode layer 20b of the gate electrode 20. A source electrode 40 of, e.g., a metal, is formed so as to cover the interlayer dielectric film 30, and to electrically connect to the N⁺ type diffusion layer 8. The interlayer dielectric film 30 is formed to electrically isolate the gate electrode 20 from the source electrode 40. A drain electrode (not shown in the drawing) is formed on one side of the semiconductor substrate 2 opposite from the N⁻ type epitaxial layer 4.

As shown in FIG. 2, the gate electrode 20 formed in each trench 12 is connected, at the end portions, to a gate-leading electrode 25 formed of, e.g., polycrystalline silicon. The gate-leading electrode 25 is also formed along the edges of the semiconductor chip 1 by removing one corner thereof, as shown in FIG. 2. In this area of the semiconductor chip 1, a gate pad 27 of, e.g., a metal, is formed, which is electrically connected to the gate-leading electrode 25.

Thus, in the semiconductor device of this embodiment, since the gate electrode 20 formed in each trench 12 is the gate of one MOSFET cell, the gates of a plurality of MOSFET cells are commonly connected, and the drains 2 and the sources 8 of the MOSFET cells are also commonly connected respectively.

In this embodiment, the hollow portion 24 is defined by the electrode layer 20b of a silicide of each gate electrode 20 so as to extend from the surface of the gate dielectric film 14 at the bottom of the trench 12 to the uppermost portion of the trench 12. Accordingly, when a stress is generated at the interface between the electrode layer 20b of a silicide and the electrode layer 20a of polycrystalline silicon, the strain caused by such a stress is absorbed by the hollow portion 24. Accordingly, no crack is formed in the N⁺ type diffusion layer 8 serving as a source and the P type diffusion layer 6. As a result, there is no increase in the leakage current Idss flowing between the drain and the source, thereby improving the reliability of the semiconductor device. Furthermore, since the gate electrode 20 is not provided at the bottom of the trench 12, the capacitance Cgd between the gate and the drain is decreased as compared to the conventional devices. Moreover, the gate electrode 20 includes the electrode layer 20b formed of a silicide, which has a lower resistance. Accordingly, the semiconductor device can operate at a higher speed compared to the conventional devices.

Next, a method of manufacturing a semiconductor device according to this embodiment will be described with reference to FIGS. 3 to 11.

Figure 3:
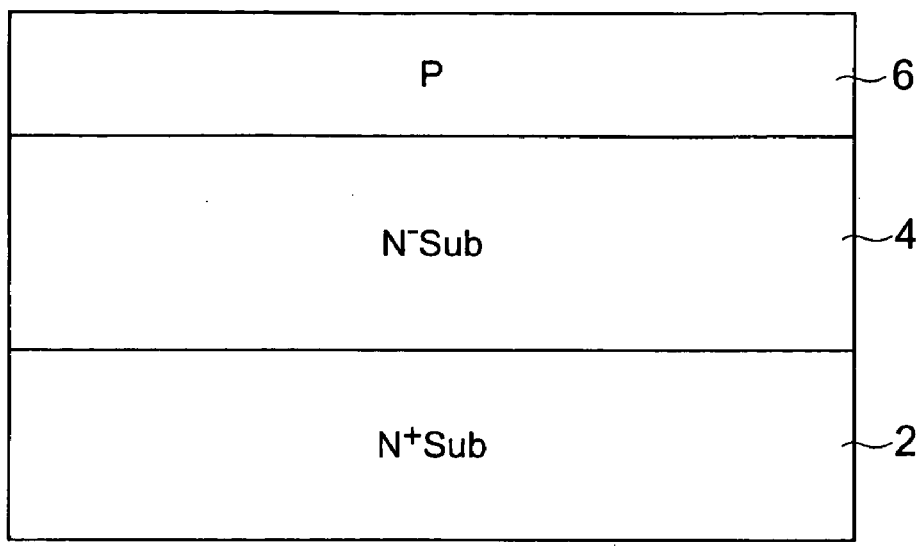
FIG. 3 is a sectional view showing a step of a method of manufacturing the semiconductor device according to the first embodiment of the present invention.
Figure 4:
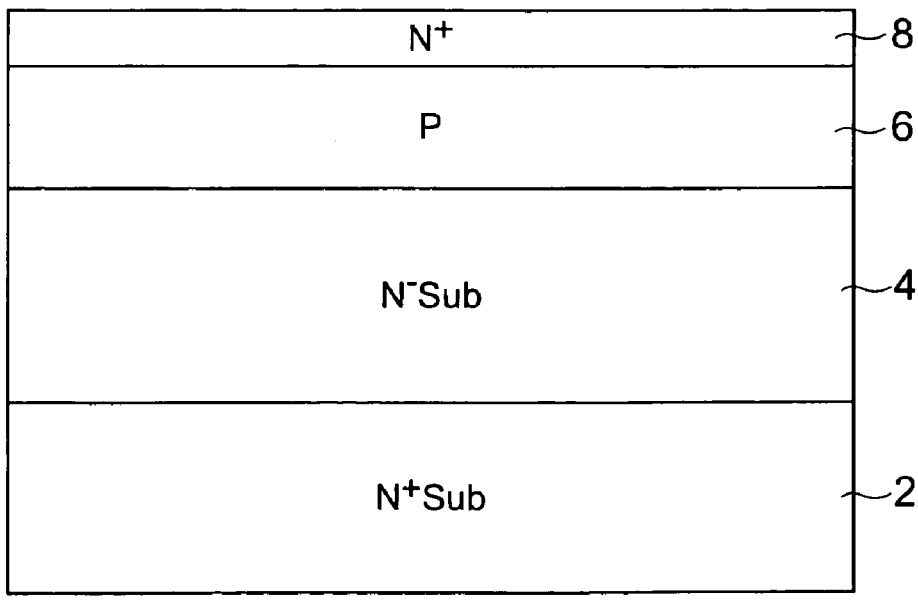
FIG. 4 is a sectional view showing a step of the method of manufacturing the semiconductor device according to the first embodiment of the present invention.

First, as shown in FIG. 3, an N⁻ type epitaxial layer 4 is formed on an N⁺ type semiconductor substrate 2, and a P type diffusion layer 6 is formed on the N⁻ type epitaxial layer 4. Subsequently, a first pattern (not shown) of SiO₂ is formed on a portion of the diffusion layer 6 where a gate extractor electrode 25 and a gate pad 27 are to be formed. Then, an N⁺ type diffusion layer 8 is formed on the P type diffusion layer 6 as shown in FIG. 4, using the first pattern as a mask.

Figure 5:
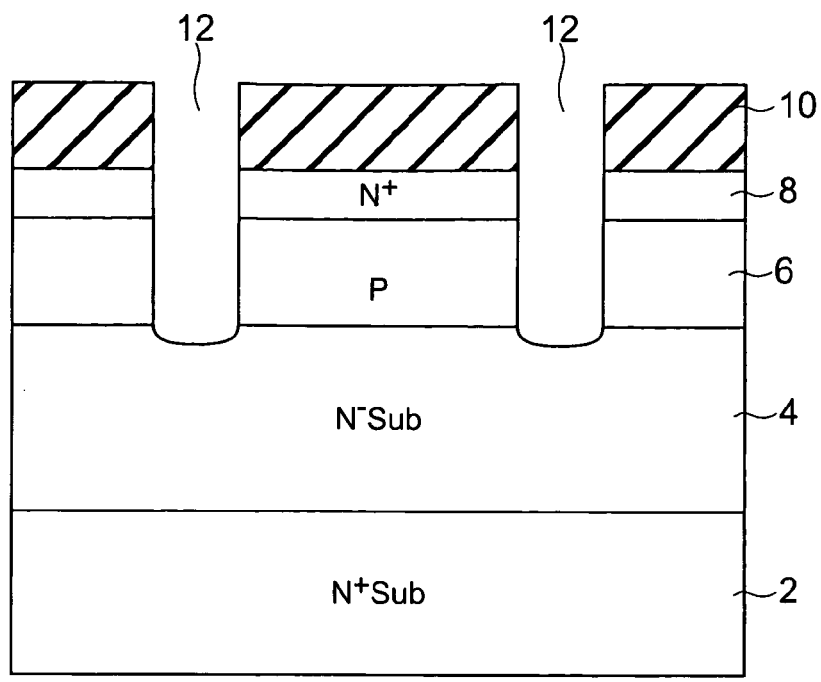
FIG. 5 is a sectional view showing a step of a method of manufacturing the semiconductor device according to the first embodiment of the present invention.

Then, as shown in FIG. 5, a second pattern 10 of, e.g., SiO₂ is formed on the N⁺ type diffusion layer 8, and a trench 12 is formed through the N⁺ type diffusion layer 8 and the P type diffusion layer 6 so as to reach the N⁻ type epitaxial layer 4, using the second pattern 10 as a mask. Thereafter, the first pattern and the second pattern 10 are removed.

Figure 6:
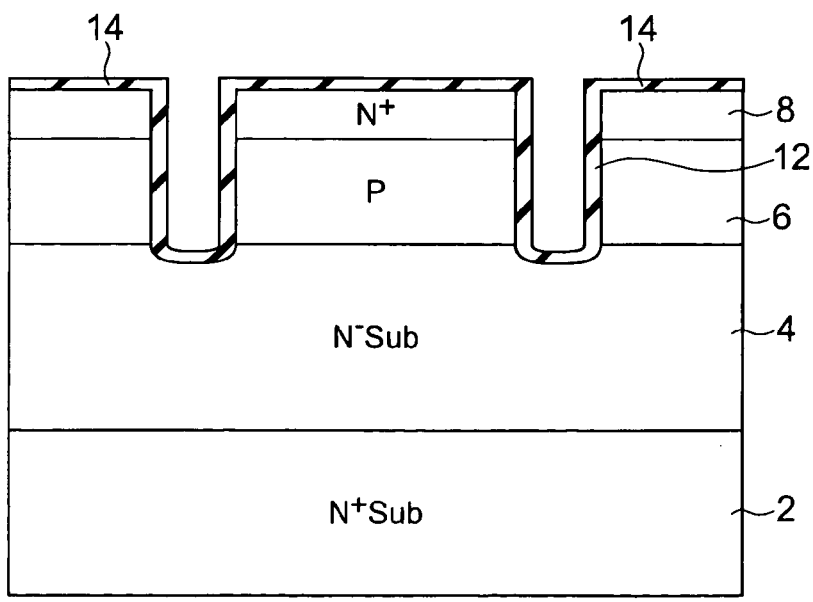
FIG. 6 is a sectional view showing a step of a method of manufacturing the semiconductor device according to the first embodiment of the present invention.
Figure 7:
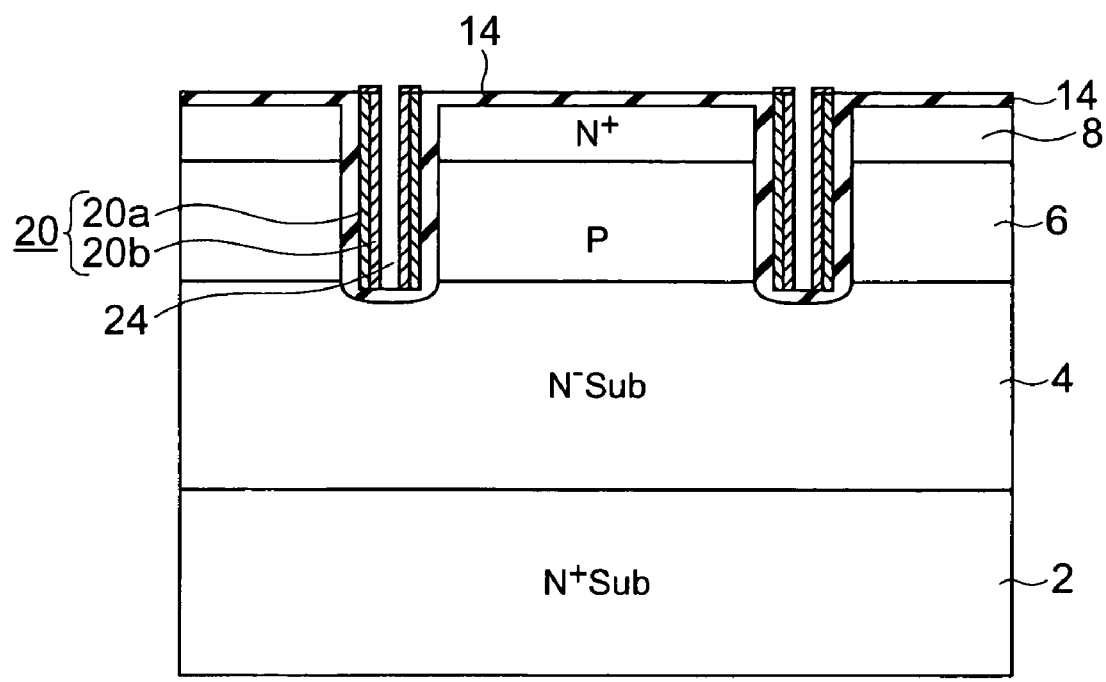
FIG. 7 is a sectional view showing a step of a method of manufacturing the semiconductor device according to the first embodiment of the present invention.

Then, as shown in FIG. 6, a gate dielectric film 14 having a predetermined thickness is formed to cover the bottom and side portions of the trench 12. Subsequently, as shown in FIG. 7, a gate electrode 20 is formed in the trench 12 so as to include a hollow portion 24 extending from the bottom portion to the uppermost portion of the trench 12, and the gate extractor electrode 25 as shown in FIG. 2 is also formed. The detail of the formation of the gate electrode 20 will be described below with reference to FIGS. 8A to 8C.

First, a polycrystalline silicon layer is formed on the gate dielectric film 14 on the bottom and side portions of the trench 12. The polycrystalline layer covers the gate dielectric film 14, but does not completely fill in the trench 12. After an impurity is doped into the polycrystalline layer, a third pattern (not shown) of, e.g., a resist, is formed on the gate extractor electrode 25 shown in FIG. 2. Then, etch back of the polycrystalline layer is performed using the third pattern as a mask, thereby flattening the polycrystalline layer except for the area where the gate extractor electrode 25 is formed, and exposing the gate dielectric film 14 at the bottom of the trench 12. As a result, an electrode layer 20a of polycrystalline silicon doped with an impurity is formed in the trench 12 along the gate dielectric film 14, as shown in FIG. 8A.

After the third pattern is removed, a Ti layer and a TiN layer are sequentially formed on the entire surface, thereby forming a laminated layer 21 composed of Ti/TiN. Thereafter, a heat treatment is performed, causing silicon of the electrode layer 20a formed of polycrystalline silicon to react with Ti of the multilayer 21 formed of Ti/TiN to form a silicide layer 20b of TiSi$_2$ only on the electrode layer 20a, as shown in FIG. 8B. Subsequently, wet processing is performed to selectively remove the non-reacted laminated layer 21 of Ti/TiN, thereby leaving the electrode layer 20b only on the electrode layer 20a of polycrystalline silicon. Then, as shown in FIG. 8C, a dielectric film 30 is formed on the entire surface by, e.g., a CVD (Chemical Vapor Deposition) method. In this manner, the gate electrode 20 is formed in the trench 12, and a hollow portion 24 is created in the trench 12 by the gate dielectric film 14 at the bottom portion of the trench 12, the dielectric film 30 over the trench 12, and the surface of the electrode layer 20b of the gate electrode 20. The dielectric film 30 is formed so that the trench 12 is not completely filled in. That is to say, there is no problem when the upper portion of the trench 12 is filled with the dielectric film 30.

Figure 9:
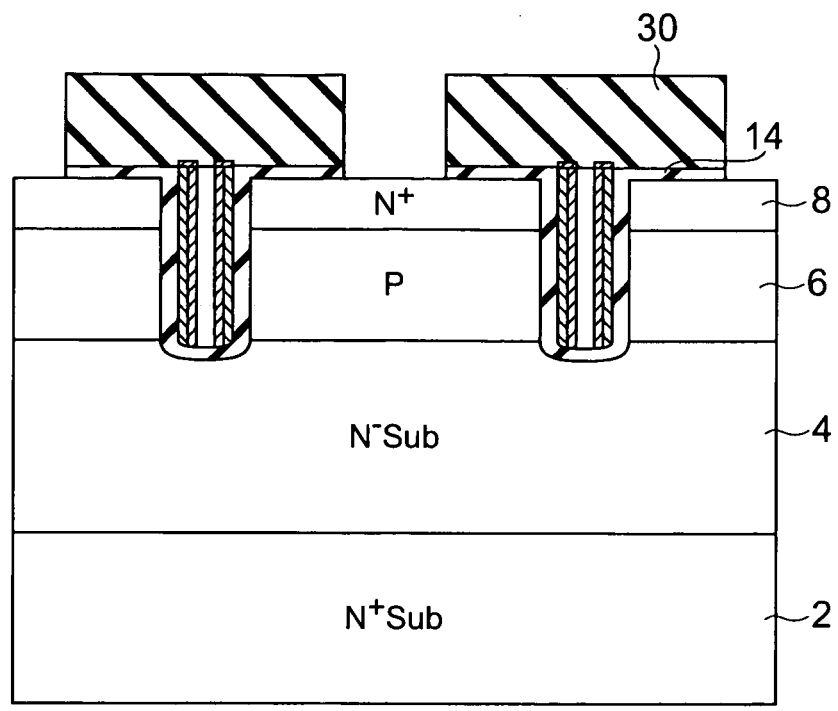
FIG. 9 is a sectional view showing a step of a method of manufacturing the semiconductor device according to the first embodiment of the present invention.

Then, as shown in FIG. 9, the dielectric film 30 and the gate dielectric film 14 are patterned using a photolithography technique. As a result, each trench 12 is covered by the patterned dielectric film 30, and the area which the gate extractor electrode 25 shown in FIG. 2 is formed is also covered by the patterned dielectric film 30.

Figure 10:
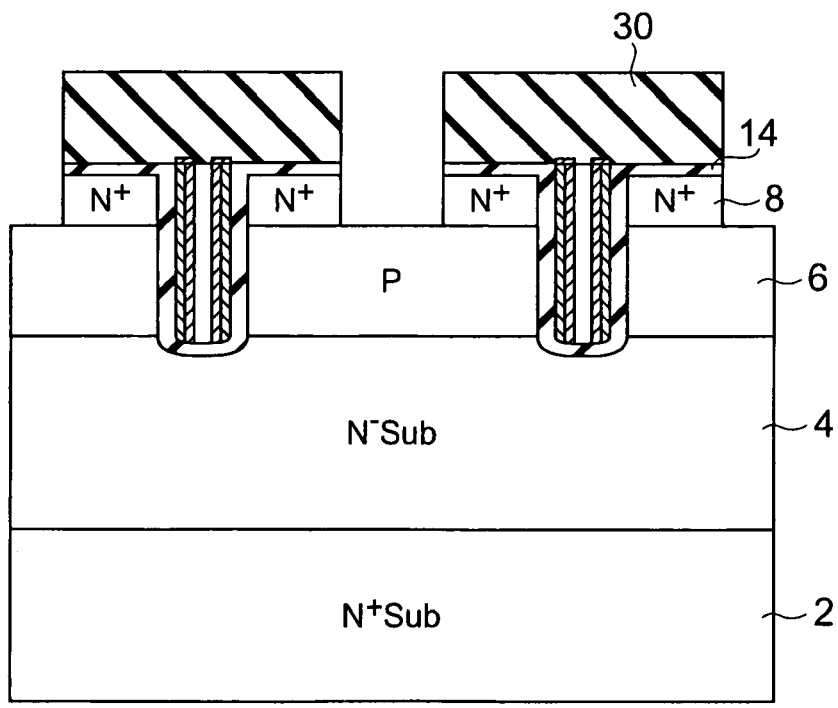
FIG. 10 is a sectional view showing a step of a method of manufacturing the semiconductor device according to the first embodiment of the present invention.

Subsequently, the N$^+$ diffusion layer 8 to serve as a source is patterned by using an RIE (Reactive Ion Etching) technique, thereby removing a part of the N$^+$ diffusion layer 8 between adjacent trenches 12, as shown in FIG. 10. As a result, in regions where the N$^+$ type diffusion layer 8 is removed, the P type diffusion layer 6 is exposed. A P type impurity is doped into the surface area of the exposed P type diffusion layer 6, thereby forming a P$^+$ type diffusion layer 32, which is intended to stabilize the threshold value of the MOSFET.

Figure 11:
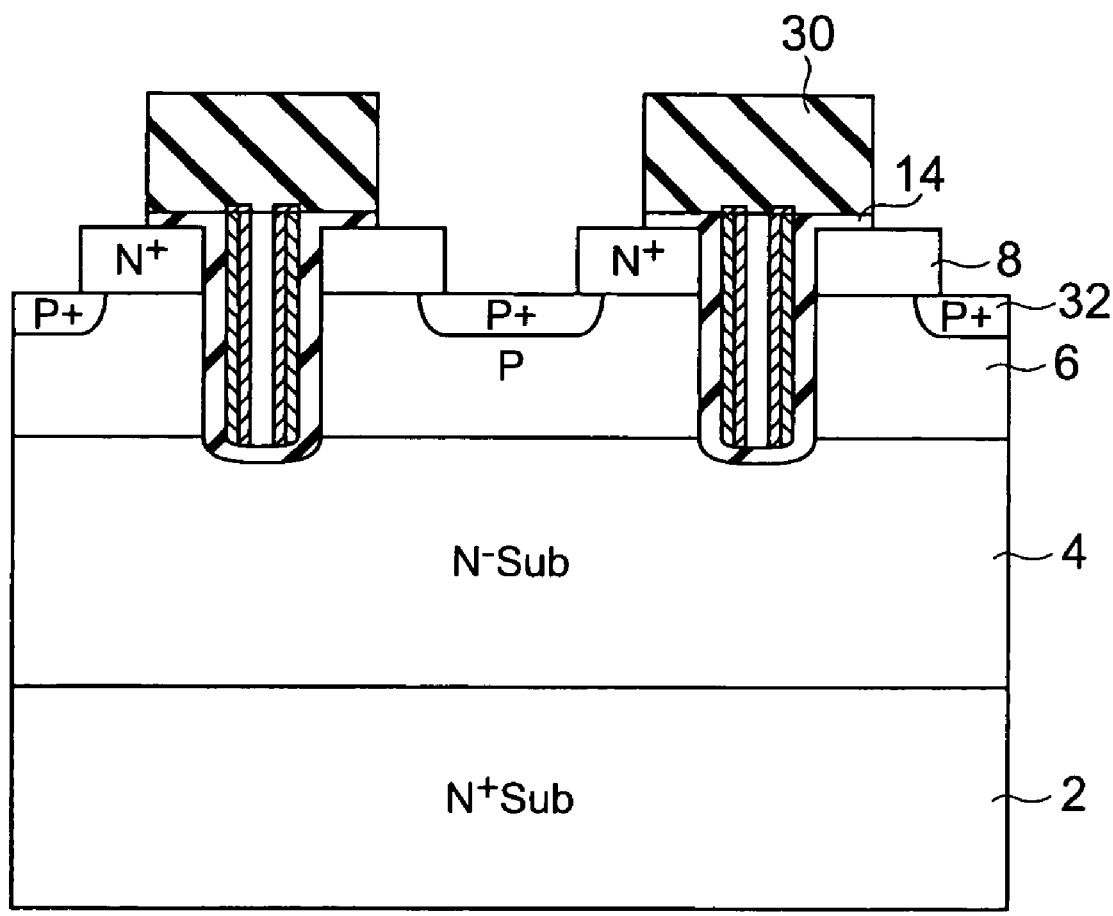
FIG. 11 is a sectional view showing a step of a method of manufacturing the semiconductor device according to the first embodiment of the present invention.

Thereafter, the dielectric film 30 and the gate dielectric film 14 are patterned by using a photolithography technique, thereby selectively exposing the surface of the N$^+$ type diffusion layer 8 and the gate extractor electrode 25 of FIG. 2, as shown in FIG. 11. Subsequently, a metal, such as Al, is deposited on the entire surface, which is then patterned by using a photolithography technique to electrically isolate the gate pattern corresponding to the gate extractor electrode 25 and the gate pad 27 of FIG. 2, and the pattern including the source electrode, thereby completing the semiconductor device.

As described above, according to this embodiment, when a stress is generated at the interface between the electrode layer 20b of a silicide and the electrode layer 20a of polycrystalline silicon, the strain caused by such a stress is absorbed by the hollow portion 24. Accordingly, no crack is caused in the N$^-$ type epitaxial layer 4 and the P type diffusion layer 6. Therefore, no increase in the leakage current Idss between the drain and source is caused, thereby improving the reliability of the device. Furthermore, since no gate electrode 20 exists at the bottom portion of the trench 12, it is possible to decrease the capacitance Cgd between the gate and the drain, thereby improving the speed of the device.

(Second Embodiment)

Next, the structure of a semiconductor device according to the second embodiment of the present invention will be described with reference to FIGS. 12A to 12D, which are sectional views showing the steps of a process of manufacturing a semiconductor device according to this embodiment, in which the thickness of an electrode 20b of silicide constituting a gate electrode 20 is increased as compared to the semiconductor device of the first embodiment shown in FIG. 1. Aside from this, the structure of the semiconductor device of this embodiment is the same as that of the first embodiment.

Figure 12A:
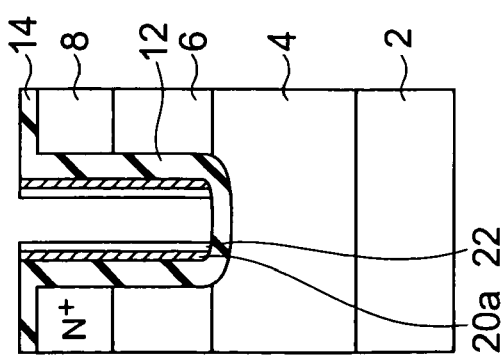
FIGS. 12A to 12D are sectional views showing steps of a method of forming a gate electrode of a semiconductor device according to the second embodiment of the present invention.

Next, the formation of the gate electrode 20 of the semiconductor device of this embodiment will be described. As shown in FIG. 12A, a gate dielectric film 14 having a predetermined thickness is formed along the interior surface of the trench 12. Subsequently, a polycrystalline layer is formed on the gate dielectric film 14 at the bottom and side portions of the trench 12 so as to cover the gate dielectric film 14 but not to completely fill in the trench 12. After an impurity is doped into the polycrystalline layer, the etch back of the polycrystalline layer is performed to flatten the polycrystalline layer and to expose the gate dielectric film 14 at the bottom of the trench 12. In this manner, an electrode layer 20a, to which an impurity is doped, is formed along the gate dielectric film 14 in the trench 12, as shown in FIG. 12A. Next, a polycrystalline layer is formed in the trench 12 so as to cover the electrode layer 20a. Then, the etch back of the polycrystalline layer is performed to flatten the polycrystalline layer and to expose the gate dielectric film 14 at the bottom of the trench 12. In this manner, a polycrystalline layer 22 covering the electrode layer 20a is formed in the trench 12, as shown in FIG. 12A.

Figure 12B:
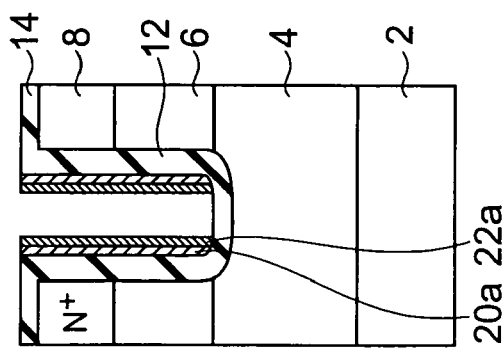
Figure 12C:
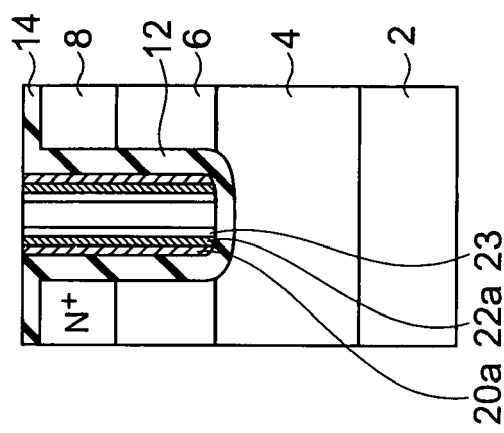

Subsequently, a Ti layer and a TiN layer are sequentially formed, and a heat treatment is performed, by which silicon of the polycrystalline layer 22 and Ti are reacted. As a result, the polycrystalline layer 22 changes into a silicide layer of TiSi$_2$. Then, the wet processing is performed to selectively remove the Ti layer and the TiN layer, thereby forming a silicide layer 22a of TiSi$_2$ only on the electrode layer 20a, as shown in FIG. 12B.

Thereafter, a polycrystalline silicon layer is formed in the trench 12 so as to cover the silicide layer 22a. Then, the etch back of the polycrystalline layer is performed to flatten the polycrystalline layer and to expose the gate dielectric film 14 at the bottom of the trench 12. In this manner, a polycrystalline layer 23 covering the silicide layer 22a in the trench 12 is formed in the trench 12, as show in FIG. 12C.

Figure 12D:
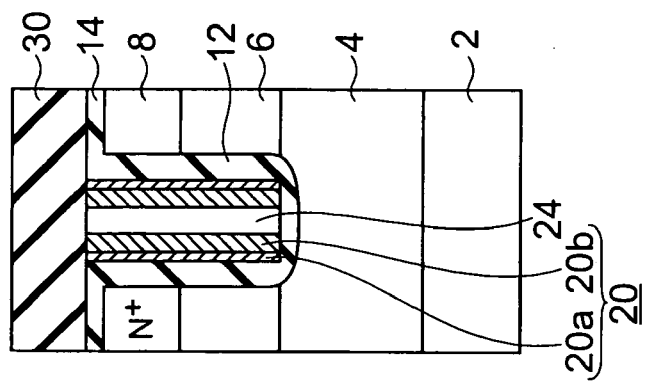

Subsequently, a Ti layer and a TiN layer are sequentially formed, and a heat treatment is performed, by which silicon of the polycrystalline layer 23 and Ti are reacted. As a result, the polycrystalline layer 23 changes into a silicide layer of $TiSi_2$. Then, the wet processing is performed to selectively remove the Ti layer and the TiN layer, thereby forming a silicide layer of $TiSi_2$ only on the silicide layer 22a. The silicide layer thus formed is combined with the silicide layer 22a, to constitute an electrode layer 20b of a silicide, as shown in FIG. 12D. The electrode layer 20b formed of a silicide is thicker than the electrode layer 20a formed of polycrystalline silicon. Thereafter, a dielectric film 30 is formed by, e.g., a CVD method. In this manner, a hollow portion 24 is defined in the trench 12 by the gate dielectric film 14 at the bottom of the trench 12, the surface of the electrode layer 20b of a silicide, and the dielectric film 30.

Although the silicide layer of this embodiment is formed in two steps, the number of steps can be three or more.

As described above, according to this embodiment, it is possible to increase the thickness of the electrode layer 20b of a silicide in comparison to the first embodiment, thereby decreasing the resistance of the gate electrode 20, resulting in it being possible to perform a switching operation at a higher speed.

Furthermore, in this embodiment, the hollow portion 24 is formed in the trench 12 as in the case of the first embodiment. Accordingly, when a stress occurs at the interface between the electrode layer 20b of a silicide and the electrode layer 20a of polycrystalline silicon, the strain caused by the stress is absorbed by the hollow portion 24. As such, no crack is generated in the N⁻ type epitaxial layer 4 and the P type diffusion layer 6. Due to this, no increase in the leakage current Idss is caused between the drain and the source, thereby improving the reliability of the device.

(Third Embodiment)

Figure 13:
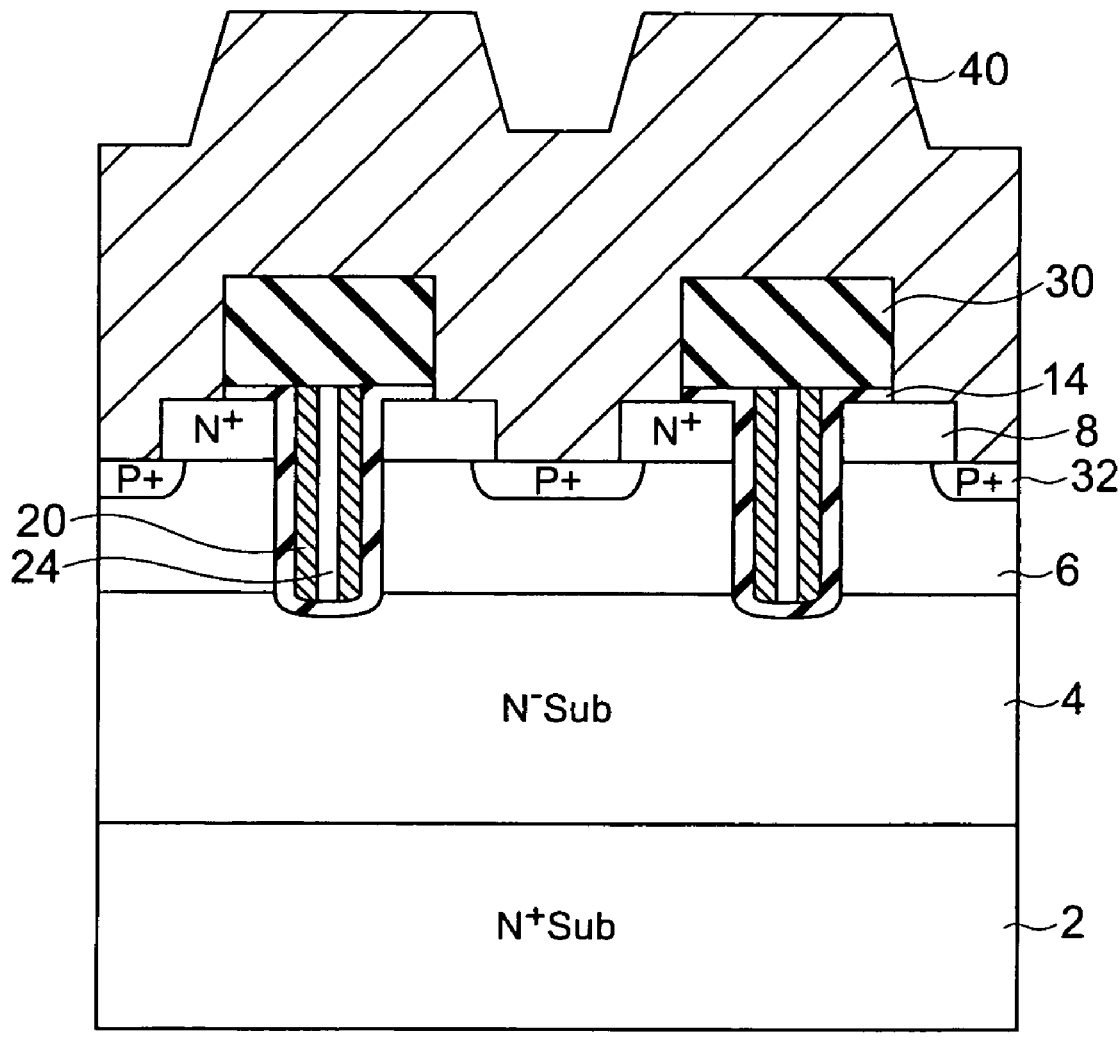
FIG. 13 is a sectional view showing the structure of a semiconductor device according to the third embodiment of the present invention.

Next, a semiconductor device according to the third embodiment of the present invention will be described with reference to FIG. 13, which is a sectional view showing the structure of the semiconductor device of this embodiment. The difference between the semiconductor device of this embodiment and that of the first embodiment shown in FIG. 1 lies in that the material of a electrode layer 20a of a gate electrode 20 is changed from polycrystalline silicon to a silicide. That is to say, the gate electrode 20 is formed only of a silicide. Aside from this, the semiconductor device of this embodiment has the same structure as that of the first embodiment.

Figure 14C:
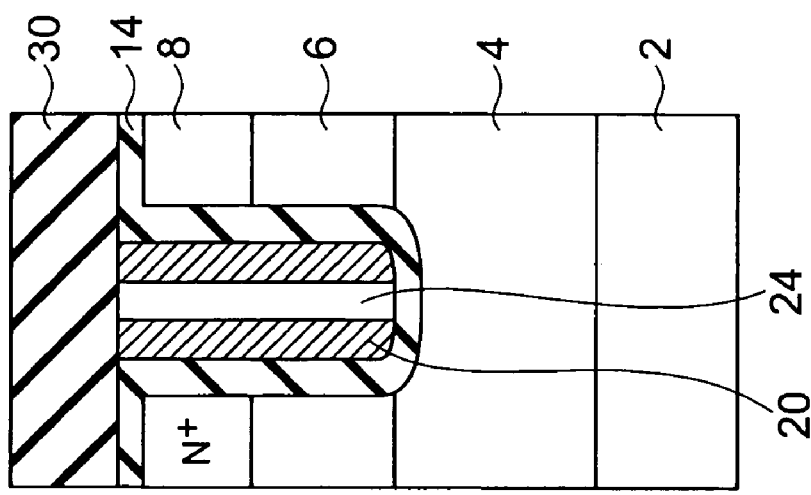
FIGS. 14A to 14C are sectional views showing steps of a method of forming a gate electrode of a semiconductor device according to the third embodiment of the present invention.

The formation of the gate electrode 20 of the semiconductor device according to this embodiment will be described with reference to FIGS. 14A to 14C. First, as shown in FIG. 14A, a gate dielectric film 14 having a predetermined thickness is formed along the interior surface of the trench 12. Then, a polycrystalline layer is formed on the gate dielectric film 14 at the bottom and side wall in the trench 12 so as to cover the gate dielectric film 14 at the bottom and side wall in the trench 12 but not to completely fill in the trench 12. After an impurity is doped into the polycrystalline layer, the etch back of the polycrystalline layer is performed to flatten the polycrystalline silicon layer and to expose the gate dielectric film 14 at the bottom of the trench 12. As a result, an electrode layer 20a of polycrystalline silicon doped with an impurity is formed along the gate dielectric film 14 in the trench 12, as shown in FIG. 14A.

Figure 14B:
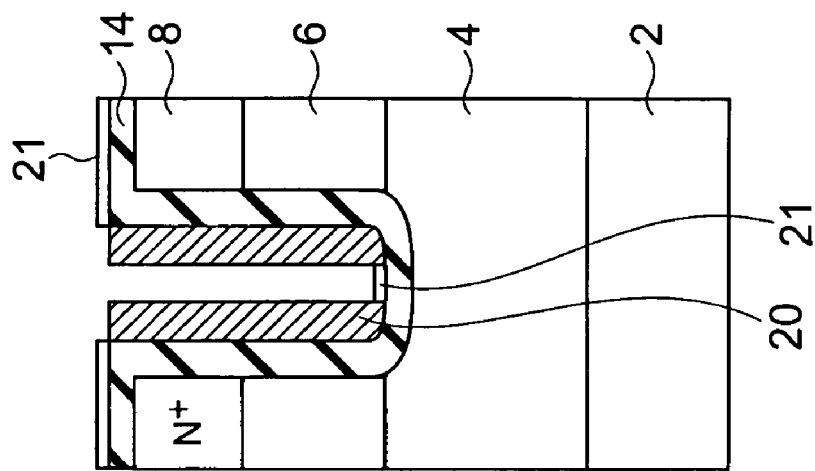
Figure 14A:
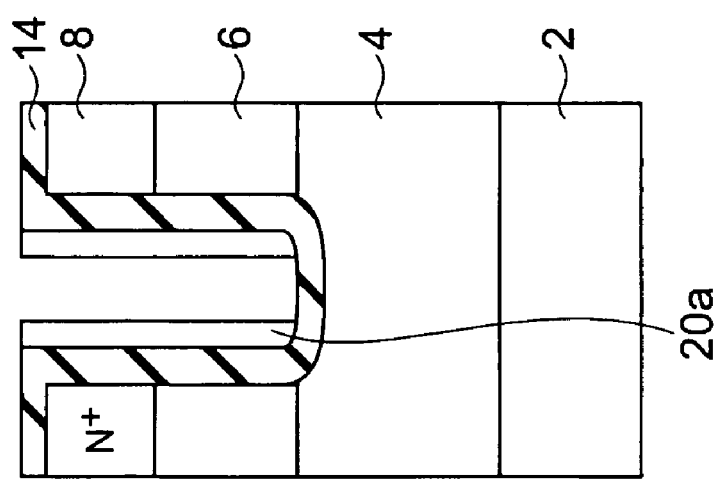
Figure 15:
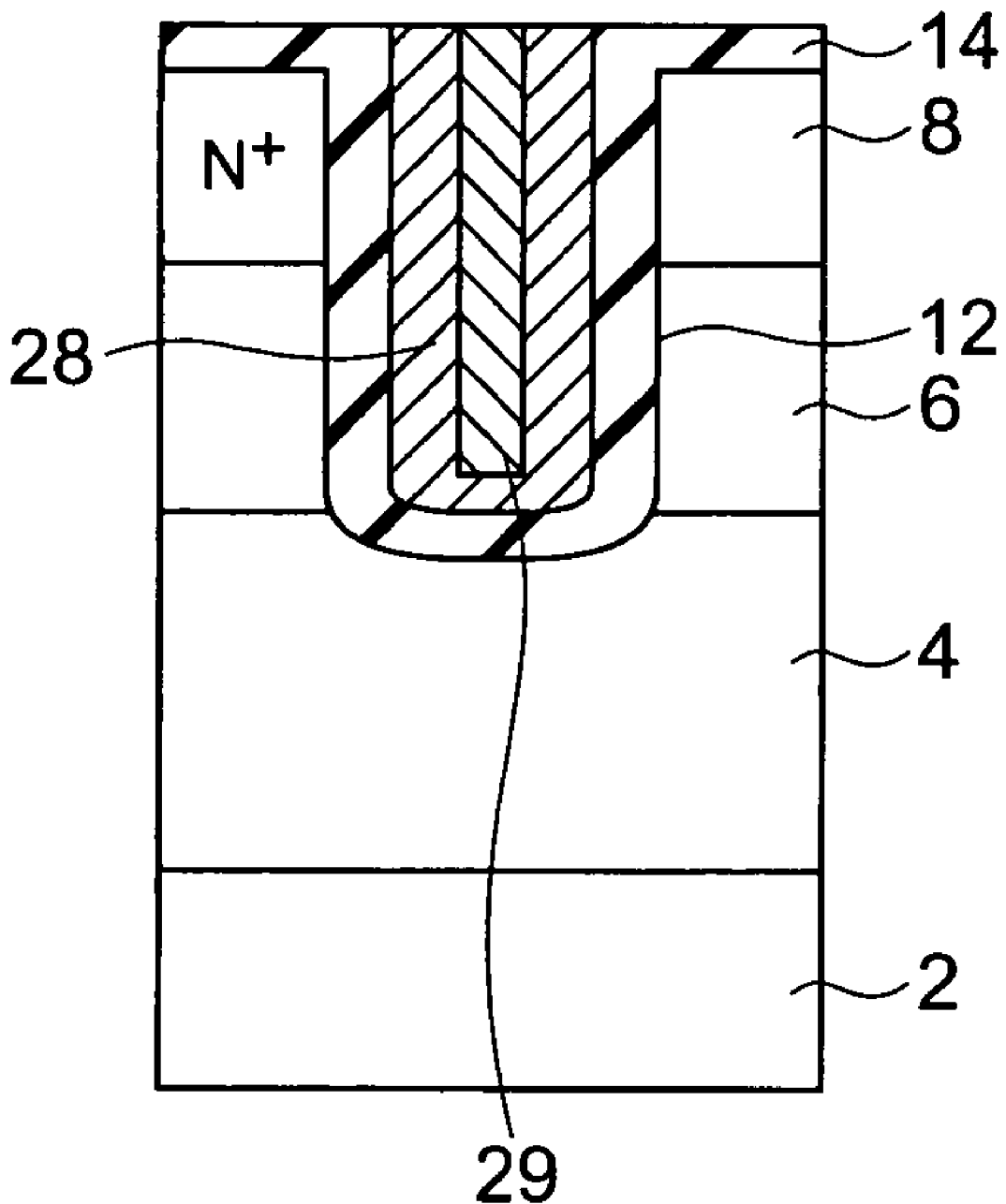
FIG. 15 is a sectional view showing the structure of the gate electrode of a conventional semiconductor device.

Subsequently, a Ti layer and a TiN layer are sequentially formed to constitute a laminated layer 21 of Ti/TiN, as shown in FIG. 14B. Thereafter, a heat treatment is performed. As a result, silicon of the polycrystalline layer 20a and Ti are reacted so that the polycrystalline layer 20a changes into a silicide layer of $TiSi_2$. Thereafter, the wet processing is performed to selectively remove the Ti layer and the TiN layer, thereby forming a gate electrode 20 of a silicide layer, as shown in FIG. 14C. Then, a dielectric film 30 is formed by, e.g., a CVD method. In this manner, a hollow portion 24 is defined in the trench 12 by the gate dielectric film 14 at the bottom of the trench 12, the surface of the gate electrode 20 of a silicide, and the dielectric film 30.

Although the silicide layer is formed in a single step in this embodiment, the number of steps can be two or more.

As described above, according to this embodiment, the gate electrode 20 is formed only of a silicide. Accordingly, the resistance of the gate electrode 20 is decreased as compared with the first and second embodiments, resulting in that the switching operation can be performed at a higher speed.

Furthermore, since the hollow portion 24 is formed in the trench 12 as in the case of the first embodiment, no crack is caused in the N⁻ type epitaxial layer 4 and the P type diffusion layer 6. Accordingly, no increase in the leakage current Idss between the source and the drain is caused, thereby improving the reliability of the device.

It should be noted that the present invention is not limited to the aforementioned embodiments, but various modifications can be performed without departing from the scope of the present invention. For example, although a silicide containing Ti is used to constitute the gate electrode in the aforementioned embodiments, a silicide containing other high melting-point metals such as Ni, Co, etc., can be used in a similar formation process. Furthermore, although the present invention is applied to MOSFETs having a trench gate structure in the aforementioned embodiments, the present invention can also be applied to other types of semiconductor devices having a trench structure, such as an IGBT (Insulated Gate Bipolar Transistor), an IEGT (Injection Enhanced Insulation Gate bipolar Transistor), etc.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A semiconductor device comprising:
   a first semiconductor layer of a first conductivly type;
   a second semiconductor layer of a second conductivity type formed on the first semiconductor layer, the second conductivity type being different from the first conductivity type;
   a third semiconductor layer of the first conductivity type selectively formed on the second semiconductor layer;
   a trench formed through the third semiconductor layer and the second semiconductor layer to reach the first semiconductor layer;
   a gate dielectric film formed along side and bottom surfaces of the trench, and a gate electrode formed to be in contact with the gate dielectric film at the side surfaces of the trench, surfaces of the gate electrode that are opposite to the surfaces contacting the gate dielectric film, and the gate dielectric film at a bottom of the trench forming a hollow portion extending from the bottom to an opening side of the trench.

2. The semiconductor device according to claim 1, wherein the gate electrode includes a first electrode layer formed of a first electrode material, the first electrode layer being in contact with the gate dielectric film, and a second electrode layer formed of a second electrode material, the second electrode layer being in contact with the first electrode layer.

3. The semiconductor device according to claim 2, wherein a resistance of the second electrode material is lower than that of the first electrode material.

4. The semiconductor device according to claim 2, wherein the second electrode material is a silicide.

5. The semiconductor device according to claim 3, wherein the second electrode layer is formed of a silicide, and thicker than the first electrode layer.

6. The semiconductor device according to claim 1, wherein the gate electrode is formed of a silicide.

7. The semiconductor device according to claim 1, further comprising a fourth semiconductor layer of the first conductivity type formed to be en contact with a surface of the first semiconductor layer opposite from the second semiconductor layer, a concentration in the fourth semiconductor layer being higher than that in the first semiconductor layer.

8. The semiconductor device according to claim 7, wherein a plurality of the third semiconductor layers are formed on the second semiconductor layer, a plurality of the trenches are formed each corresponding to one of the third semiconductor layers, the gate dielectric film and the gate electrode are formed in each trench, and the gate electrodes in the trenches are commonly connected electrically.

9. The semiconductor device according to claim 8, further comprising a dielectric film covering an upper surface of the gate electrode of each trench, and a source electrode covering the dielectric film and being electrically connected to the third semiconductor layers.

10. The semiconductor device according to claim 9, further comprising a fifth semiconductor layer of the second conductivity type formed in the second semiconductor layer, a concentration in the fifth semiconductor layer being higher than that in the second semiconductor layer.

11. The semiconductor device according to claim 10, wherein the source electrode is electrically connected to the fifth semiconductor layer.

12. The semiconductor device according to claim 9, further comprising a drain electrode formed to be in contact with a surface of the fourth semiconductor layer opposite from the first semiconductor layer, the drain electrode being electrically connected to the fourth semiconductor layer.

13. The semiconductor device according to claim 8, wherein the gate electrode includes a first electrode layer formed of a first electrode material, the first electrode layer being in contact with the gate dielectric film, and a second electrode layer formed of a second electrode material, the second electrode layer being in contact with the first electrode layer.

14. The semiconductor device according to claim 13, wherein a resistance of the second electrode material is lower than that of the first electrode material.

15. The semiconductor device according to claim 13, wherein the second electrode material is a silicide.

16. The semiconductor device according to claim 14, wherein the second electrode layer is formed of a silicide, and thicker than the first electrode layer.

17. The semiconductor device according to claim 8, wherein the gate electrode is formed of a silicide.

* * * * *